United States Patent
Dvorsky et al.

(10) Patent No.: US 10,439,255 B2
(45) Date of Patent: Oct. 8, 2019

(54) OPTICAL MONITORING OF BATTERY HEALTH

(71) Applicant: Battelle Memorial Institute, Columbus, OH (US)

(72) Inventors: James E. Dvorsky, Plain City, OH (US); Steven M. Risser, Reynoldsburg, OH (US); James H. Saunders, Worthington, OH (US); Alexander C. Morrow, Gahanna, OH (US); David W. Nippa, Dublin, OH (US)

(73) Assignee: Battelle Memorial Institute, Columbus, OH (US)

( * ) Notice: Subject to any disclaimer, the term of this patent is extended or adjusted under 35 U.S.C. 154(b) by 588 days.

(21) Appl. No.: 14/414,984

(22) PCT Filed: Aug. 9, 2013

(86) PCT No.: PCT/US2013/054302
§ 371 (c)(1),
(2) Date: Jan. 15, 2015

(87) PCT Pub. No.: WO2014/026093
PCT Pub. Date: Feb. 13, 2014

(65) Prior Publication Data
US 2015/0155605 A1    Jun. 4, 2015

Related U.S. Application Data
(60) Provisional application No. 61/681,669, filed on Aug. 10, 2012.

(51) Int. Cl.
*H01M 10/48* (2006.01)
*G01R 1/07* (2006.01)
(Continued)

(52) U.S. Cl.
CPC .............. *H01M 10/48* (2013.01); *G01R 1/07* (2013.01); *G01R 31/382* (2019.01);
(Continued)

(58) Field of Classification Search
CPC ...... H01M 10/48; H01M 2/16; H01M 2/1606; H01M 2/1653; H01M 2/1666; H01M 2/18;
(Continued)

(56) References Cited

U.S. PATENT DOCUMENTS 5,949,219 A *  9/1999  Weiss .................... G01N 21/31
                                                            320/136
2001/0019794 A1  9/2001  Horie et al.
(Continued)

FOREIGN PATENT DOCUMENTS

JP    2000215870 A    8/2000
JP    2003344020 A    12/2003

OTHER PUBLICATIONS

Hintermaier, Frank; International Search Report and Written Opinion; International Application No. PCT/US2013/054302; dated Oct. 30, 2015; The International Bureau of WIPO, Geneva, Switzerland.
(Continued)

*Primary Examiner* — Richard Isla
*Assistant Examiner* — Dung V Bui
(74) *Attorney, Agent, or Firm* — Stevens & Showalter, L.L.P.

(57) ABSTRACT

Light is transmitted through or from a separator of a battery cell or scattered within a battery cell and received by one or more light detectors. The light that is normally transmitted through the separator is scattered, absorbed, wavelength-shifted or otherwise distorted by an impending fault in the vicinity of or within the separator. The change in light due to the impending fault is measured by a detector and a signal
(Continued)

from the detector is processed to identify the impending fault so that a warning can be generated indicative of the impending fault.

23 Claims, 6 Drawing Sheets

(51) Int. Cl.
*H01M 2/16* (2006.01)
*G01R 31/36* (2019.01)
*G01R 31/382* (2019.01)
*G01R 31/396* (2019.01)
*H01M 2/14* (2006.01)

(52) U.S. Cl.
CPC ............ *G01R 31/396* (2019.01); *H01M 2/14* (2013.01); *H01M 2/1606* (2013.01); *H01M 2/1653* (2013.01); *H01M 2/1666* (2013.01)

(58) Field of Classification Search
CPC .... G01M 11/00; G01M 11/35; G01M 11/086; G01R 31/36; G01R 31/3658; G01R 31/3606; G01R 1/07
USPC ................................ 324/426, 96; 429/50, 90
See application file for complete search history.

(56) References Cited

U.S. PATENT DOCUMENTS

| | | | |
|---|---|---|---|
| 2005/0210672 A1 | 9/2005 | Reynolds et al. | |
| 2006/0102455 A1* | 5/2006 | Chiang .................. | F03G 7/005 200/181 |
| 2006/0170410 A1* | 8/2006 | Bjorn .................. | G01R 15/246 324/96 |
| 2009/0099799 A1* | 4/2009 | Barsoukov ......... | G01R 31/3606 702/63 |
| 2009/0123826 A1* | 5/2009 | Nitzan .................... | H01M 2/16 429/144 |
| 2009/0246620 A1 | 10/2009 | Lee et al. | |
| 2010/0124250 A1 | 5/2010 | Lachenmeier et al. | |
| 2010/0175235 A1* | 7/2010 | Nielsen .................. | H01G 9/035 29/25.03 |
| 2011/0054561 A1* | 3/2011 | Visco .................... | A61B 18/02 607/35 |
| 2011/0148359 A1* | 6/2011 | Noguchi ............... | H02J 7/0047 320/134 |
| 2011/0200863 A1* | 8/2011 | Xiao ....................... | H01M 2/16 429/144 |
| 2011/0236735 A1 | 9/2011 | Fuse | |
| 2012/0070713 A1* | 3/2012 | Whear .................... | C08L 89/00 429/143 |
| 2012/0070714 A1* | 3/2012 | Chambers ............... | C08L 89/00 429/145 |
| 2012/0070747 A1* | 3/2012 | Whear .................. | H01M 10/06 429/247 |
| 2012/0106593 A1 | 5/2012 | Zhou et al. | |
| 2012/0115008 A1* | 5/2012 | Sano .................... | H01M 2/1653 429/144 |
| 2012/0115036 A1* | 5/2012 | Lee ....................... | H01M 2/145 429/251 |
| 2012/0148880 A1* | 6/2012 | Schaefer ........... | H01M 10/4207 429/50 |
| 2012/0188086 A1* | 7/2012 | Xie .................... | G01R 31/3606 340/636.18 |
| 2012/0249154 A1 | 10/2012 | Dao et al. | |
| 2013/0216867 A1 | 8/2013 | Schaefer et al. | |
| 2015/0226810 A1 | 8/2015 | Elian et al. | |
| 2016/0013522 A1 | 1/2016 | Morrow et al. | |

OTHER PUBLICATIONS

Related U.S. Appl. No. 14/620,568; entitled "Optical Waveguide Methods for Detecting Internal Faults in Operating Batteries;" filed Feb. 12, 2015 by James H. Saunders et al.

Related U.S. Appl. No. 14/620,600; entitled: Integral Light Sources and Detectors for an Optical Sensor to Detect Battery Faults; filed Feb. 12, 2015 by C. Alexander Morrow et al.

Related U.S. Appl. No. 14/620,635; entitled: "Battery Cell Structure With Limited Cell Penetrations;" filed Feb. 12, 2015 by James H. Saunders et al.

Wu, Hui et al.; "Improving Battery Safety by Early Detection of Internal Shorting with a Bifunctional Separator"; Oct. 13, 2014; Nature Communications.

Jianhua Han; First Office Action; Chinese Patent Application No. 201380042586.1; dated Jul. 5, 2016; State Intellectual Property Office of the People's Republic of China.

Frank Hintermaier; Notice of Intention to Grant; EPC Application No. 13750468.4; dated Mar. 17, 2016; European Patent Office; Munich, Germany.

Kaity V. Handal; Office Action; U.S. Appl. No. 14/620,635; dated Aug. 26, 2016; United States Patent and Trademark Office; Alexandria, Virginia.

Communication pursuant to Rules 161(1) and 162 EPC; European Patent Application No. 13750468.4; dated Mar. 26, 2015; European Patent Office; Munich Germany.

Bui, Dung Y.; Non-final Office Action; U.S. Appl. No. 14/620,600; dated Sep. 23, 2016; United States Patent and Trademark Office; Alexandria, Virginia.

Williams, Arun C.; Notice of Allowance; U.S. Appl. 14/620,568; dated Oct. 12, 2016; United States Patent and Trademark Office; Alexandria, Virginia.

Williams, Arun C.; Supplemental Notice of Allowability; U.S. Appl. No. 14/620,568; dated Oct. 20, 2016; United States Patent and Trademark Office; Alexandria, Virginia.

Bui, Dung V.; Non-Final Office Action; U.S. Appl. No. 14/620,600; dated Oct. 27, 2017; United States Patent and Trademark Office; Alexandria, VA.

Chandler, Kaity V.; Non-Final Office Action; U.S. Appl. No. 14/620,635; dated Feb. 1, 2018; United States Patent and Trademark Office; Alexandria, VA.

Chandler, Kaity V.; Non-Final Office Action; U.S. Appl. No. 14/620,635; dated Aug. 7, 2017; United States Patent and Trademark Office; Alexandria, VA.

Chandler, Kaity V.; Office Action; U.S. Appl. No. 14/620,635; dated May 7, 2018; United States Patent and Trademark Office; Alexandria, Virginia.

Bui, Dung V.; Notice of Allowance; U.S. Appl. No. 14/620,000; dated Oct. 3, 2018; United States Patent and Trademark Office; Alexandria, Virginia.

Bui, Dung V.; Final Office Action; U.S. Appl. No. 14/620,000; dated May 25, 2018; United States Patent and Trademark Office; Alexandria, Virginia.

Chandler, Kaity V.; Final Office Action; U.S. Appl. No. 14/620,635; dated Mar. 2, 2017; United States Patent and Trademark Office; Alexandria, VA.

Bui, Dung V.; Final Office Action; U.S. Appl. No. 14/620,600; dated May 3, 2017; United States Patent and Trademark Office; Alexandria, VA.

\* cited by examiner

OPTICAL MONITORING OF BATTERY HEALTH

GOVERNMENT LICENSE RIGHTS

This invention was made with support from the United States (US) Government under Contract No. DE-AR0000272 awarded by Advanced Research Projects Agency-Energy (ARPA-E). The US Government has certain rights in the invention.

BACKGROUND ART

The present invention relates in general to batteries and, more particularly to methods and apparatus for periodic, if not continuous, monitoring of the development of impending faults in secondary or re-chargeable batteries at the cell level using optical signals during operation of the batteries in applications such as electric vehicles and electrical grid storage.

DISCLOSURE OF INVENTION

In the invention of the present application, light is used to detect impending faults in battery cells. Light is transmitted through or from a separator of a battery cell and received by one or more light detectors. The light that is normally transmitted through the separator is scattered, absorbed, wavelength-shifted or otherwise distorted by an impending fault in the vicinity of or within the separator. The impending fault could be a physical structure, such as a dendrite, or could be the presence of chemical species associated with the degradation of the separator, electrolyte, binder, or other components of the battery cell, or it could be an increase in temperature or change in electric field associated with a local fault. The change in the light transmitted or scattered is measured by one or more light detectors and signals from the detector(s) are processed to identify impending faults so that appropriate warnings can be generated.

MODES FOR CARRYING OUT THE INVENTION

Figure 1:
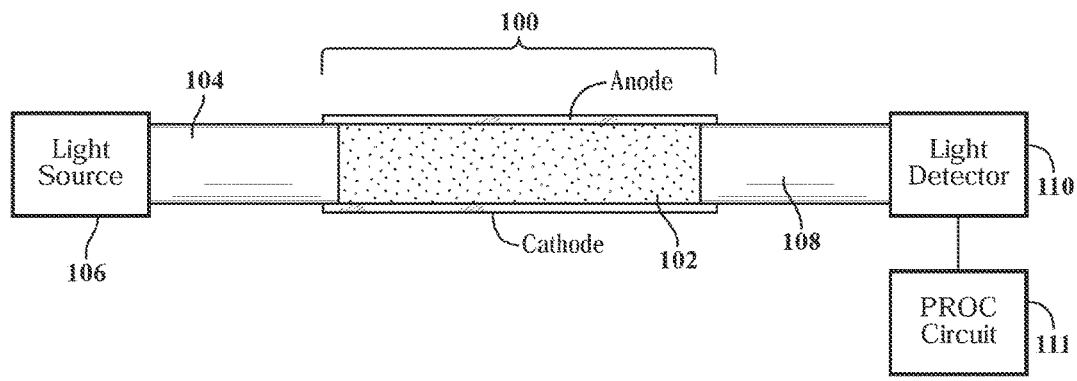
FIG. 1 schematically illustrates a battery cell separator in accordance with the teachings of the present application having a light transmitting optical fiber and a light receiving optical fiber integrated into the battery cell for monitoring the fault state of the battery cell.

State-of-the-art secondary or re-chargeable batteries, particularly those based on lithium chemistries, provide some of the highest energy densities of any electrical energy storage devices currently commercially available. Their performance has led to their widespread usage in mobile electronic devices and electric vehicles with ever increasing periods of energy availability and/or size reduction as improvements are made to the battery composition and geometry. However, along with these advantages, these batteries have also exhibited catastrophic failures that have hampered some developments, especially those associated with electric vehicles. Manufacturers of re-chargeable batteries have incorporated several ways of providing margins of safety to their devices, but it has been shown that in some cases these countermeasures are not enough. Moreover, as compositions or constructions of these batteries are modified to improve safety, their energy density often is compromised. In fact, some experts believe that commercially available assemblies may exhibit only twenty percent (20%) of the energy density and performance that is theoretically achievable in order to provide products having high margins of safety.

Several techniques, such as Electrochemical Impedance Spectroscopy (EIS), have been developed to measure degradation of lithium ion and other re-chargeable batteries. These techniques provide significant insight to the condition of individual cells of a battery pack and are often employed in research efforts. Unfortunately, most of these techniques cannot be applied to the battery in situ and certainly are not amenable to periodic if not continuous monitoring of battery fault development throughout its operating cycles and life. In fact, the operation of the battery must be interrupted to employ these diagnostic techniques, and they are too cumbersome and expensive to be considered for use on each fielded battery pack.

In accordance with the teachings of the present application, a completely different approach is taken to battery fault monitoring based on optical measurement techniques. Fundamentally, electrical performance of a battery and its associated load or charging provisions do not interfere with optical signals. Also, optical components do not interfere with the battery's operation so that continuous sensing through all phases of battery charging and discharging is possible. Using optical components that are similar in physical size to the components of a battery allows for monitoring structures to be built into or integrated with the battery cell design without significantly impacting its geometry. The teachings of the present application apply to single cell batteries and multiple cell batteries and can be used in batteries for portable electronic devices, off-grid applications, electric vehicles and the storage of electricity on the electrical grid, where the latter two applications may have hundreds or thousands of cells. The teachings of the present application are generic and should be applicable to a wide variety of battery chemistries and types.

A first embodiment of a battery cell 100 made in accordance with the teachings of the present application is shown in FIG. 1 wherein an edge of the battery cell 100 is shown. The battery cell 100 includes a battery cell separator 102 with electrolyte, which is a standard component, placed between the electrodes, anodes and cathodes, of battery cells. The separator 102 with electrolyte has light transmission characteristics that are a function of the state of impending faults of the battery cell 100. Light is transmitted into the separator 102 via a first optical fiber 104 from a light source 106 coupled to the first optical fiber 104. In accordance with the teachings of the present application, there may be one or more light sources such as light emitting diodes, semiconductor diodes, lasers, lamps and the like. In the embodiment of FIG. 1, light is transmitted through the separator 102 and received via a second optical fiber 108 by a light detector 110 coupled to the second optical fiber 108. The light detector 110 is sensitive to the wavelengths of interest which will depend on the specific structure and chemistry of the battery cell.

The detector 110 may any conventional light detector, such as a photodiode, phototransistor or a more exotic detector currently or to become available in the future. Since the light transmission characteristics of the separator 102 with electrolyte is a characteristic of the fault state of the battery cell 100, the fault state of the battery cell 100 can be determined by a processing circuit 111 that processes the output signal from the detector 110 to estimate whether an incipient fault is present in the battery cell 100. The processing circuit 111 may also process the output signal from the detector 110 to determine a temperature profile along the battery cell 100, the chemical species along the battery cell 100, the internal pressure within the battery cell 100 and the like.

Figure 2:
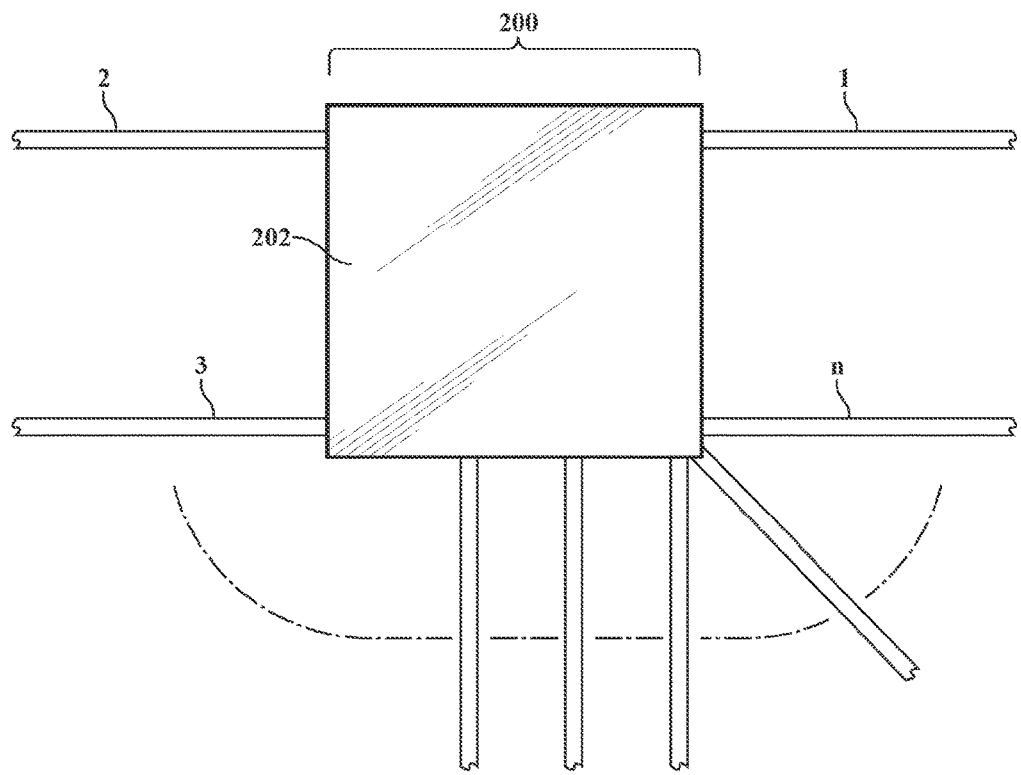
FIG. 2 schematically illustrates a battery cell separator in accordance with the teachings of the present application having light transmitting and/or light receiving optical fibers integrated into a plurality of locations around the battery cell for monitoring the fault state of the battery cell.

The thickness of battery cell separators is often tens of microns, and the optical fibers ideally have a similar or slightly smaller diameter. As described above with reference to FIG. 1, light can be sent from one fiber, such as the first fiber 104, and received by another fiber, such as the second fiber 108. Alternately, one or both of the optical fibers 104, 108 may sense optical emissions generated within the separator 102 if the light source 106 is replaced by a light detector. Moreover, multiple fibers may be arranged around the periphery of a battery cell, as shown in FIG. 2, to optimize parameter detection and even yield detection of localized faults within the cell. In FIG. 2, a face of a battery cell 200 is shown with optical fibers 1 through n being coupled to a separator 202 of the battery cell 200 at various locations around the periphery of the battery cell 200. Light sources and light detectors can be coupled to the optical fibers 1 through n as required for given monitoring applications.

Figure 3:
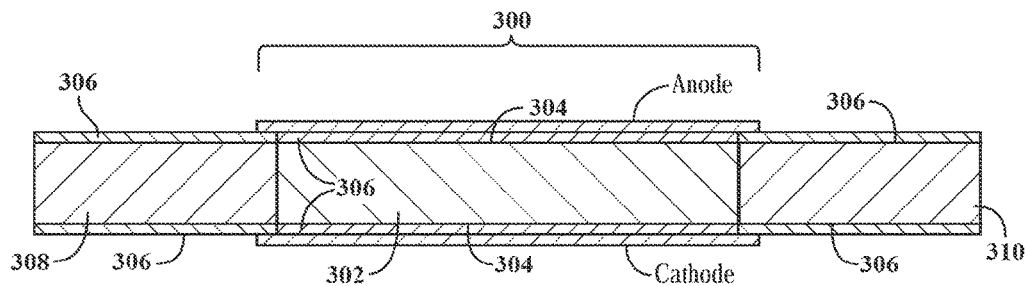
FIG. 3 schematically illustrates a battery cell separator in accordance with the teachings of the present application having a light transmitting optical fiber and a light receiving optical fiber integrated into the battery cell for monitoring the fault state of the battery cell wherein the separator includes waveguide characteristics.

The optical characteristics of a battery cell 300 can be improved by using a layered separator 302 such as that shown in FIG. 3. Like optical fibers themselves, the outer layers 306 of the separator 302 are similar to the inner core of the separator 302, but have a refractive index lower than that of the core of the separator 302. There are several known methods to cause this lower refractive index, such as use of slightly different polymer compositions, functionalization or halogenations of the inner core or outer layers, changes in polymer processing, among others. As shown in FIG. 3, the optical performance of the separator 302 can be improved by forming a layer 306 of material over the outer face surfaces 304 of the separator 302. The outer layer 306 may also be formed over optical fibers 308, 310 coupled to the separator 302. Such separators may be formed by laminating layers of material together to yield light waveguide characteristics for the separators, or the separators may be treated to reduce the refractive index only at their face surfaces.

One preferred class of materials for separators is polyolefin, such as polyethylene (PE). PE is also used in optical fibers, and cladding is created by fluorinating the surface of the fibers. A similar technique may be applied to the separator to give it improved optical wave guiding characteristics. Alternatively, a material such as polypropylene (PP), which has a lower refractive index than PE, may be laminated to each of the face surfaces of the PE layer to create a separator having optical waveguide characteristics.

Many battery separators are known to have a highly porous morphology. These pores can act to scatter light, leading to poor optical transmission through the separator. One method to reduce this optical scattering is to use light with longer wavelengths, which will scatter less from the pores. A second approach is to use an electrolyte in the battery which has refractive index similar to that of the separator. Many of the electrolytes examined more recently in the literature, such as ionic liquids, have refractive indices approaching or exceeding that of many common battery separator polymers.

In any event, light from the source(s) enters an associated separator where it may be scattered, absorbed or otherwise distorted by an impending fault condition in the vicinity or within the separator. The fault condition could be physically embodied, such as a dendrite, or could be the presence of chemical species associated with the degradation of the separator, electrolyte, binder or other components of the battery cell, or a change in temperature or electric field due to the fault condition. The change in light is measured by the detector and the processing circuit converts that electrical signal to an appropriate signal for warning of an impending fault within the system.

An alternate arrangement for a battery cell is to use an ion-conducting polymer electrolyte membrane in place of the separator 102 plus electrolyte of FIG. 1. The polymer electrolyte membrane can be made transparent and homogeneous, and may offer optical advantages over using a separator membrane plus electrolyte. The refractive index of the outer surfaces of the polymer electrolyte membrane can then be altered to enhance wave guiding, or multiple, different polymers can be laminated to form a polymer electrolyte membrane with improved light wave guiding characteristics.

Figure 4:
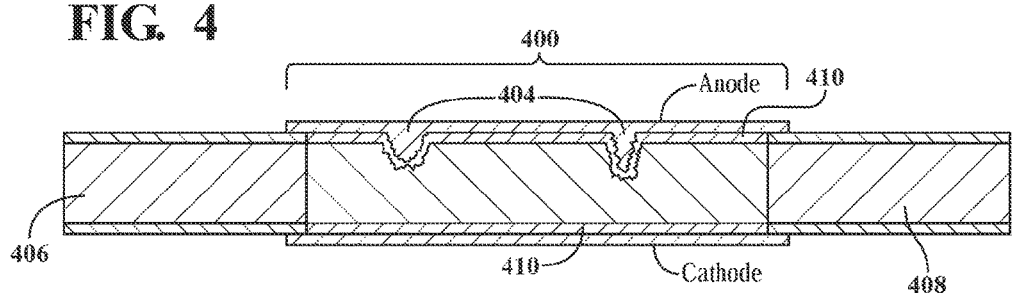
FIG. 4 schematically illustrates a Lithium Ion battery cell separator in accordance with the teachings of the present application having a light transmitting optical fiber and a light receiving optical fiber integrated into the battery cell for monitoring the fault state of the battery cell and showing the growth of Lithium into the separator.

One of the principal modes of lithium ion battery failure is shorting due to dendritic growth of lithium metal on an electrode surface of a cell 400 having a separator 402, as shown in FIG. 4. Mechanisms leading to the growth of dendrites 404 are the subject of many current research programs. However, it is generally known that if the dendrites cascade through the separator 402 and form a short circuit with the opposing electrode, large currents can flow and subsequently intense heat is generated. The heat readily impacts the rest of the battery cell and neighboring battery cells, setting off a chain reaction. In the extreme, the entire battery overheats and can burst into flames.

Accordingly, detecting the presence of metallic dendrites, such as the dendrites 404, imposing on the separator 402, is an important aspect of the battery cells of the present application. As depicted in FIG. 4, the dendrites 404 either distort the separator 402 or puncture into it, and these perturbations of or intrusions into a separator having waveguide characteristics can be detected using optical techniques. The transmission of light from one optical fiber, such as optical fiber 406, through the separator 402 to another optical fiber, such as the optical fiber 408, will be diminished and significant disturbances to the cladding 410 of the separator 402 will yield disproportionally greater impacts to the transmission of light. Improved sensitivity and localization of significant dendrites may be attained by employing multiple sensing fibers around the periphery of a separator, for example as shown by the separator 202 of FIG. 2.

Utilizing other optical effects caused by impending faults is also envisioned for the battery cells of the present application. For example, the formation of dendrites will create localized "hot spots" as the current density increases at the dendrite and resistive heating ensues. Elevated temperatures within the separator should change the index of refraction in that area or portion of the battery cell, creating a change of input-to-output signal characteristics of the separator. In addition, localized heating will create an infrared (IR) signature that is different from the rest of the cell, even if the entire cell is experiencing elevated temperature due to current flow. The IR wavelengths may be passively detected by one or more detectors associated with optical fibers integrated into the separator of the battery cell as described above.

By further manipulation of either the separator or optical fiber composition or both, other battery fault conditions can be monitored. For example, materials designed to react to the presence of electric fields could provide an early detection of dendrite formation. Since an electric potential is present across the separator and the microscopic features of the dendrite distort and accentuate the electric field at the tip of the growing dendrite, materials designed to sense and optically respond to these fields would produce a unique response from optical detectors associated with battery cells in accordance with the teachings of the present application.

As is known, not all battery degradations are due to dendritic formations. Over time, electrolyte chemistry can also change, and the formation of new compounds within a battery cell should be detectable using other optical measurements, such as changes in the IR absorption spectra of the separator in the battery cell. For example, according to research conducted at the University of Michigan, gases may be formed at electrode-to-separator boundaries with such gas formation leading to increased pressure within a battery cell. These same gases could react with engineered separators and optical fibers to yield readily detectable optical signatures indicative of the gas presence. In addition, as thermal runaway is initiated, the electrolyte breaks down into other compounds, which could similarly be detected optically. Other degradations in electrode or electrolyte may be detected similarly. Reactions may produce luminescence or the fiber configuration could support spectroscopic measurement techniques.

An alternate method to sense thermal runaway could be achieved by creating a wave guiding separator using materials where the inner wave guiding layer changes refractive index differently from the outer layers. In most polymers, the refractive index decreases with increasing temperature, but the rate of this decrease varies from polymer to polymer. If the refractive index of the wave guiding layer or layers decreases more rapidly than that of the outer layers of the optical fiber, there will be a temperature at which the refractive indices are equal. As the temperature approaches this value, the wave guiding properties will be lost and the membrane will become more lossy. This increase in optical loss could be used as an indicator of excess temperature in the cell. By controlling the composition of the different layers it should be possible to tune the temperature where the lossy behavior begins to facilitate optical detection.

Two general classes of separators that can be used in the invention of the present application will now be described. The first separator class is gelled polymer membranes, in which a solvent is used to gel a polymer. These gelled polymer membranes generally have good optical clarity, but commonly are thick (>200 microns) and may have low ionic conductivity. The inventors of the present application have demonstrated that it is possible to fabricate these gelled polymer membrane using ionic liquids as the solvent, and including the corresponding lithium salt[1]. More particularly, they have demonstrated that it is possible to sandwich these membranes between glass slides and then use a hot press to make the membranes sufficiently thin for use as battery separators without decreasing the optical clarity.

[1] The concept is suitable for all ionic liquids where there is a corresponding lithium salt available, i.e., a salt where the anion is the same as the ionic liquid, but the cation is lithium.

In a first example, an ionic liquid based sodium ion conducting gel polymer electrolyte was prepared as reported in *Solid State Ionics* 181 (2010) 416-423, which is incorporated herein by reference, by replacing the sodium triflate with lithium triflate. This membrane was placed onto a glass slide which had first been coated with a low refractive index polymer, for example a low index fluoropolymer such as EP-18, a 50/50 copolymer of hexafluorobutyl methacrylate and tetrafluoropropyl methacrylate, and then covered with a second glass slide which also had a low refractive index polymer coating. The membrane was then hot pressed at a temperature of 275° C. for ~1 hour to 100 μm with shims and left to cool to room temperature prior to releasing pressure.

Figure 5:
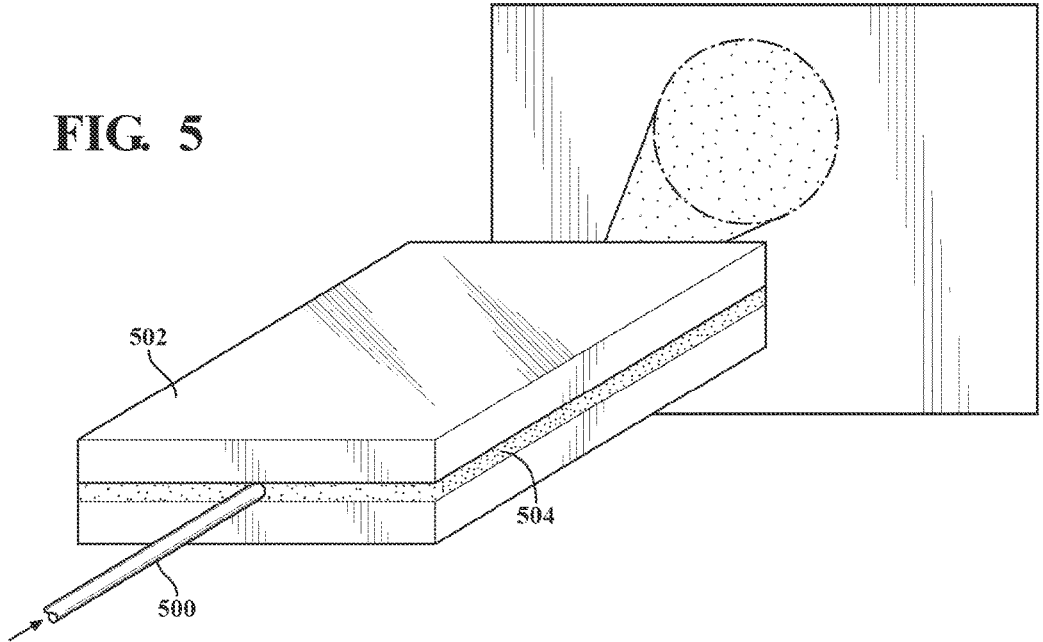
FIG. 5 schematically illustrates light guiding characteristics of a gelled polymer membrane sandwiched between two glass slides by butt-coupling an optical fiber to the membrane and inserting visible 633 nm light.
Figure 6:
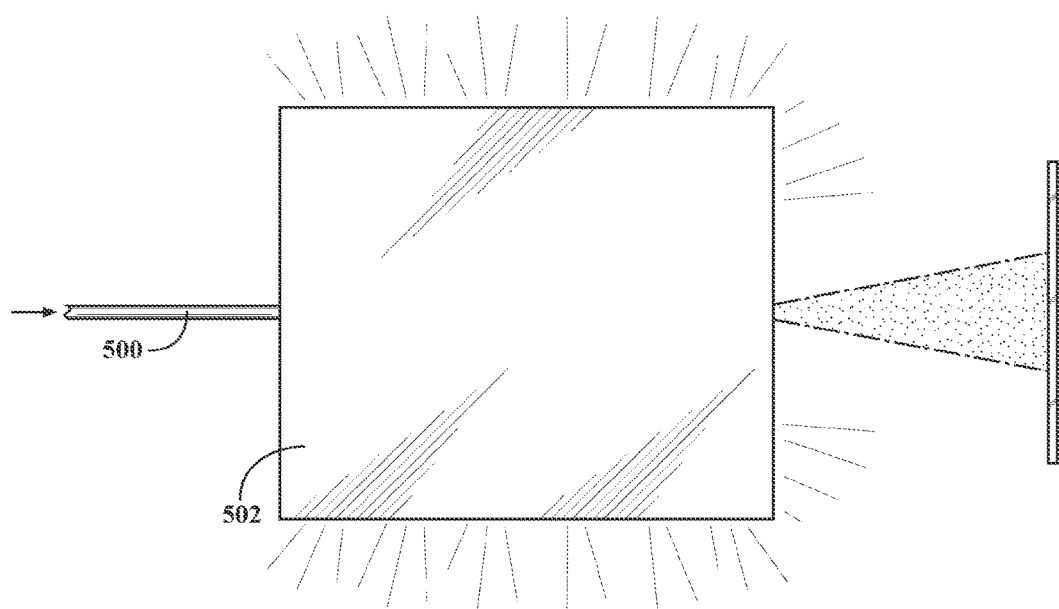
FIG. 6 schematically illustrates a side view of the membrane of FIG. 5 showing transmission of light throughout the membrane as indicated by the scatter light emitted from the side edge of the membrane.
Figure 7:
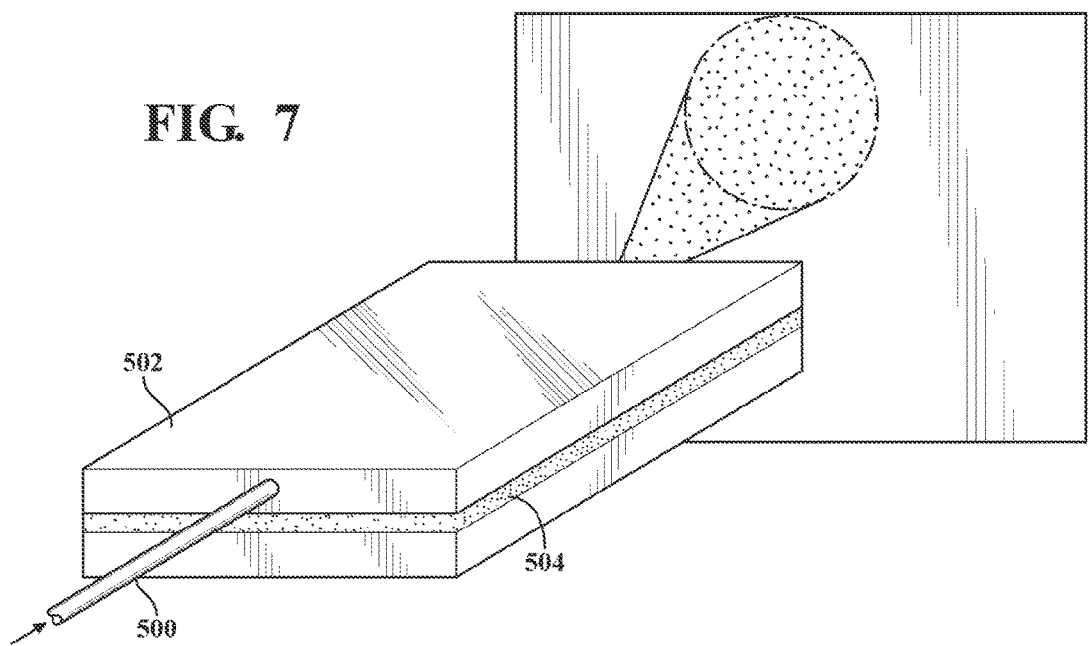
FIG. 7 schematically illustrates reduced scattering when the fiber optic is coupled to the glass slide rather than the membrane as shown in FIGS. 5 and 6.

The light guiding characteristics of the membrane were then examined by butt-coupling an optical fiber 500 to the sample 502 as shown in FIG. 5, and inserting visible 633 nm light into the fiber 500. When the fiber 500 was coupled to the membrane 504, light was scattered throughout the membrane, but a large fraction of light exited the far end of the membrane, as shown in FIG. 5. FIG. 6 is a top view of the sample 502 showing transmission of light through the sample 502 as well as scattering of light throughout the sample 502 illustrated by light exiting membrane via the sides of the sample 302. FIG. 7 illustrates coupling the fiber 500 to the glass slide which resulted in much less scattering.

The second separator class is the porous polyolefin separator, which consists of a thin (<35 micron) film of a polymer such as polyethylene or polypropylene which has been drawn to produce a highly porous membrane. The separator is preferably below 35 microns to reduce impedance. While separators have been created as thin as 4 microns, they do not have the mechanical integrity needed. The size of the pores is controlled by the drawing process, but the pores can be below 100 nm in size with pores of 25 nm or below being available in the industry. It is currently believed that a pore size less than ~½ the wavelength of the light or smaller is better, the smaller the better as long as it satisfies the other properties needed for the separator.

The transmission of light through this membrane is controlled by the scattering of light from the pores. The scattering of light from a single spherical scatterer can be calculated directly, for example by applying teachings of van de Hulst. For additional information see van de Hulst H., Light scattering by small particles, 1957, J. Wiley & Sons, NY. Table 1 below shows light scattering form a single spherical particle as a function of the ratio of the refractive index of the electrolyte (particle) to that of the membrane (medium) and the number of particles in a box that measures 25 microns by 25 microns by 1 centimeter (cm). Such a box represents the region a light ray might trace in traveling through a 1 cm section of a separator. The number of particles is representative of a membrane having porosity of 40%. Thus, for a spherical scatterer 200 nm in diameter, if the refractive index of the membrane and electrolyte differ by 0.01, over 95% of the light would be transmitted and not scattered. Also, if the particle has a diameter of 100 nm, a refractive index difference of 0.04 would still correspond to more than a 91% transmission of light. Although the calculations have been performed for the electrolyte index lower than the membrane, the results are similar if the ionic liquid refractive index is higher by the same amount.

TABLE 1

Scattering by spherical particles.

| | | | | | | |
|---|---|---|---|---|---|---|
| lambda (nm) | 1550 | 1550 | 1550 | 1550 | 1550 | 1550 |
| diameter (nm) | 50 | 100 | 200 | 100 | 100 | 100 |
| polymer index | 1.49 | 1.49 | 1.49 | 1.49 | 1.49 | 1.49 |
| electrolyte index | 1.48 | 1.48 | 1.48 | 1.47 | 1.46 | 1.45 |
| cross section (micron2) | 1.108E−11 | 7.092E−10 | 4.5386E−08 | 2.843E−09 | 6.410E−09 | 1.142E−08 |
| number density for box 25 micron by 25 micron by 1 cm | 3.82E+10 | 4.77E+09 | 5.97E+08 | 4.77E+09 | 4.77E+09 | 4.77E+09 |
| BLOCKED AREA (micron^2) | 4.23E−01 | 3.39E+00 | 2.71E+01 | 1.36E+01 | 3.06E+01 | 5.45E+01 |
| BLOCKED AREA (%) | 0.07% | 0.54% | 4.33% | 2.17% | 4.90% | 8.72% |

Table 2 below shows the scattering for needle-shaped particles, such as might represent pores through a thin-film membrane. In the case of needle-shaped particles, the scattering is larger than for the spherical particles, but it is still possible to get light transmission of over 90%.

TABLE 2

Scattering by needle-shaped particles.

| | | | | |
|---|---|---|---|---|
| lambda (nm) | 1550 | 1550 | 1550 | 1550 |
| diameter (nm) | 50 | 100 | 50 | 100 |
| Length (nm) | 25000 | 25000 | 25000 | 25000 |
| polymer index | 1.49 | 1.49 | 1.49 | 1.49 |
| electrolyte index | 1.48 | 1.48 | 1.485 | 1.485 |
| cross section (micron2) | 1.030E−06 | 1.649E−05 | 2.573E−07 | 4.117E−06 |
| number density for box 25 micron by 25 micron by 1 cm | 5.09E+07 | 1.27E+07 | 5.09E+07 | 1.27E+07 |
| BLOCKED AREA (micron^2) | 5.25E+01 | 2.10E+02 | 1.31E+01 | 5.24E+01 |
| BLOCKED AREA (%) | 8.40% | 33.59% | 2.10% | 8.39% |

There are several ionic liquids that satisfy the refractive index requirements listed above. The refractive index of the polymer in the membrane will be in the range of 1.49 to 1.51, depending on the film processing. Table 3 below shows a list of some ionic liquids which have refractive indices in the range discussed above. The refractive index will change slightly upon addition of the salt, and will also change with the temperature of the ionic liquid.

TABLE 3

Properties of some ionic liquids.

| ionic liquid | ref ind |
|---|---|
| 1-ethyl-3-methylimidazolium tosylate | 1.538 |
| 1-hexyl-3-methylimidazolium chloride | 1.515 |
| 1-methyl-3-octylimidazolium chloride | 1.505 |
| 1-ethylpyridinium ethylsulfate | 1.50252 |
| 1,3-dimethylimidazolium methyl sulfate | 1.4827 |
| 1-butyl-3-methylimidazolium 2-(2-methoxyethoxy)ethyl sulfate | 1.48 |
| 1-butyl-3-methylimidazolium methylsulfate | 1.47942 |
| 1-ethyl-3-methylimidazolium ethyl sulfate | 1.4794 |
| 1-butyl-3-methylimidazolium perchlorate | 1.4725 |
| 1-ethyl-3-methylimidazolium octyl sulfate | 1.471 |

The calculations described above were performed in the limit of individual scatterers, assuming the incident field for each scatterer is a plane wave. In the case of a highly porous membrane, there will be significant interaction between the scatterers. There have been multiple studies performed to understand the physics of multiple, closely packed scatterers, many of these associated with understanding the physics of human vision. These studies have shown that the scattering loss in these cases is often an order of magnitude or more, smaller than would be expected when treating the objects as isolated scatterers.

Figure 8A:
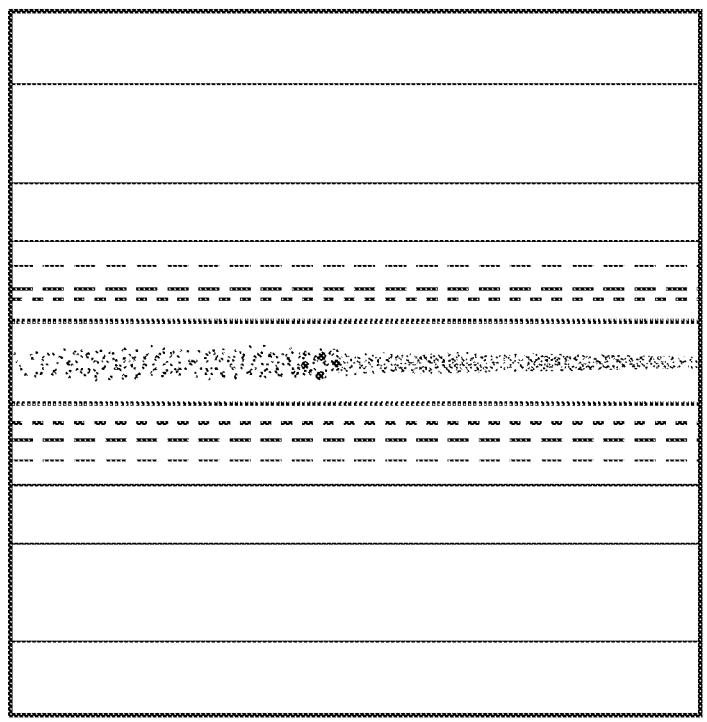
FIGS. 8A and 8B illustrate calculations showing that the scattering loss in the case of multiple closely packed scatterers is smaller than would be expected when treating the objects as isolated scatterers.
Figure 9A:
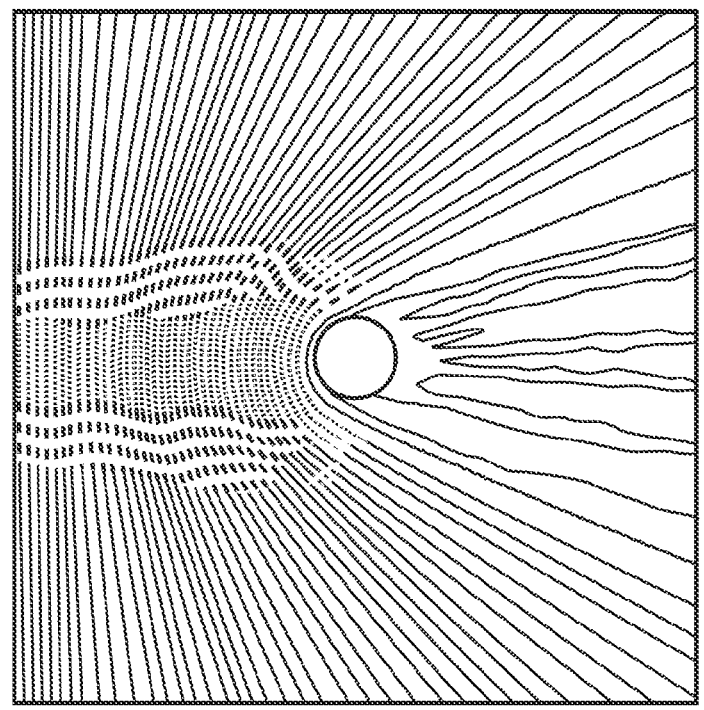
FIGS. 9A and 9B show significant scattering from a single scattering object when the object is metallic.
Figure 8B:
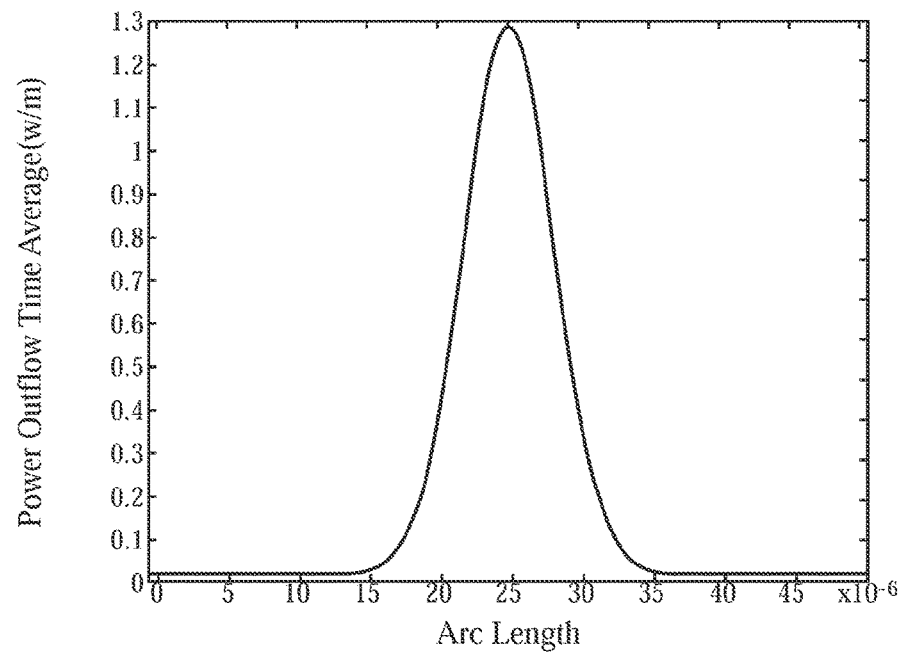
Figure 9B:
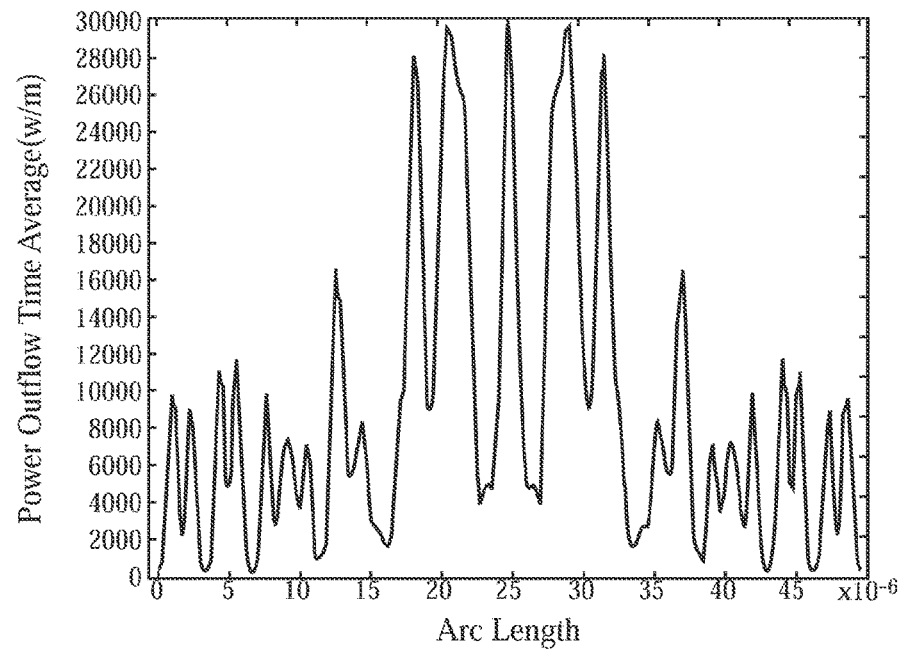

The basic results of these calculations have been verified through use of finite element modeling (FEM) of the scattering loss from a single spherical particle in the path of a light beam. The results of one such calculation is shown in FIGS. 8A and 8B, which shows the scatterers do not alter the propagation of the light or alter the power distribution. However, when the scattering object is metallic, such as a dendrite, there is significant scattering, as is shown in FIGS. 9A and 9B.

While the previous calculations are encouraging, it is known that closely spaced scattering sites do not act individually and that they result in definitive interference patterns. Accordingly, the inventors have reviewed the literature to find methods for enhancing light transmission through a separator. The inventors conclude that by controlling the spatial variation in index of refraction due to pore size and other structures and materials to meet certain conditions related to the variation of index of refraction within the separator, even more light should be transmitted through the porous structures providing the structures meet certain conditions, i.e., the regularity of the spacing between the pores and the regularity of the size of the pores since the more randomness there is in either factor, the more scattering.

Arrays of scattering structures are common in biological systems. For instance, the cornea of the human eye is composed of closely spaced, ordered arrays of cylindrical collagen structures. Despite the prevalence of scattering sites, the healthy lens and cornea are both transparent to visible light (see Johnsen, 2012, *The Optics of Life*, Princeton University Press). This was not well understood for some time. Maurice in 1957 showed that if the cylinders were considered single scatterers, then more than 90 percent of the light would be scattered and the cornea would be opaque. In 1971, Benedek (see Benedek, G. B. (1971) *Theory of Transparency of the Eye*, Appl. Optics 10 (3) 459-602) showed that this apparent inconsistency could be explained by considering the interference pattern of arrays of the cylindrical structures. Benedek showed that a variation of the index of refraction length scale less than approximately one-half the wave length of light will not be scattered and the array would be transmissive to that light, even if the array was not well ordered in a lattice. Prum et al. have used this theory to explain a variety of color patterns in nature (see R. O. Prum and R. H. Torres (2003) *A Fourier Tool for the Analysis of Coherent Light Scattering by Bio-Optical Nanostructures*, Integr. Comp. Biol 43 591-602). Essentially, they used a Fourier decomposition to evaluate the scattering at each wavelength of incident light, determining the selective scattering due to the nano-scaled surface structure for species ranging from birds to butterflies.

Applying this broad conclusion to the porous membrane structures of the present application, the inventors find that candidate polymers should be transparent if the scale of the variations of index of refraction caused by mismatch between the pores and space between pores is less than one-half the wavelength of the transmitted light. Typically this can result in scattering that is an order of magnitude less than the calculation results obtained by assuming scattering by an array of independent single scatters. Matching the index of refraction between the polymer and ionic solution will further reduce the scattering.

With an assumed IR light source of 1500 nm, we need the structural variations to be less than 750 nm or 0.75 microns. Some commercial grade separators are claiming pore sizes less than this. Consequently, the inventors have discovered that separators with spatial variations of index of refraction less than one-half the wavelength of incident light, or separators with spatial variations that meet the criteria for transparency proposed by Benedek and calculated by Prum et al., are candidates for the optical separator described in the present application. Currently, some commercial battery separators are expected to meet this criteria for light transmission. The structural variations in index of refraction can be due to the pore size, where the pores may contain the electrolyte, trapped gases or liquids or particles, or other materials. As long as these variations meet the criteria described herein, they may be considered as candidates for use in the invention of the present application. Other techniques described in the present application may be used in combination with this aspect of the invention of the present application.

One of the challenges in using an optical separator is the extraction of light from the separator so that methods for enhancing light extraction from the membrane are of interest. As seen in FIG. 6, scattering in the separator can result in light being widely distributed within the membrane. One method to enhance the amount of light that can be collected is to modify the membrane near light emission edge to act as a lens. The refractive index of the light can be slightly modified to help funnel light toward the specific points on the edge where fibers will be connected. This refractive index modification can take place by various means, including thermal stress to slightly densify the polymer, chemical modification to increase or decrease the refractive index, or increased or decreased porosity imparted during manufacture. The change in refractive index in any of these methods can be controlled to channel the light exiting the separator toward a few discrete points, increasing the light collected by associated fibers.

An alternate approach to transmitting electromagnetic radiation through the battery does not depend as explicitly on the properties of the separator. For this alternate approach, the two electrodes define walls of a metallic waveguide. Longer wavelength radiation can be propagated through the cell, using the >30 micron spacing between the electrodes to determine the appropriate wavelength of radiation to be used. The loss behavior of metallic waveguides is well-understood since these waveguides are used in many microwave applications. Another option for this approach is to use a high dielectric material to define the walls of the waveguide, allowing propagation of longer wavelength radiation.

Two general classes of separators that can be used in the invention of the present application have been mentioned above. In the first gelled polymer separators, the electrolyte is used to gel the polymer resulting in separators with quasi-homogeneous structure but decreased ionic transport. In the second class of separators, conventional polyolefin separators are used with an ionic liquid electrolyte. The refractive index of the polyolefin is typically in the range 1.49 to 1.52, and the ionic liquid electrolyte is selected to have a closely matching refractive index to minimize scattering loss. Although ionic liquids are used in batteries for research, the cost of the ionic liquids and their relative impure compositions have prevented ionic liquids from being used as the electrolyte for large scale commercial battery production.

In accordance with the teachings of the present application, there is an additional class of separator plus electrolyte pairing that can be used in the context of using a battery separator as an optical waveguide. The separator can be made from polyvinylidene fluoride (PVDF), which is commonly used to make separators. The refractive index of PVDF is about 1.42, varying to some degree dependent on processing, which is close to the refractive index of many common battery electrolytes such as propylene carbonate (RI=1.4189), vinyl ethylene carbonate (RI=1.45) or ethylene carbonate (RI=1.4158). A mixture of these carbonates can be formulated that closely matches the refractive index of the PVDF separator, particularly when the lithium salt is incorporated into the electrolyte.

One of the challenges when a separator is used as an optical waveguide is the large numbers of separator pores, each of which can act as a scattering site. One way to obtain better waveguide performance with highly porous separators is to treat the waveguide structures to locally reduce the porosity in very narrow regions, creating local structures more suited to what is needed for waveguiding light.

Figure 10:
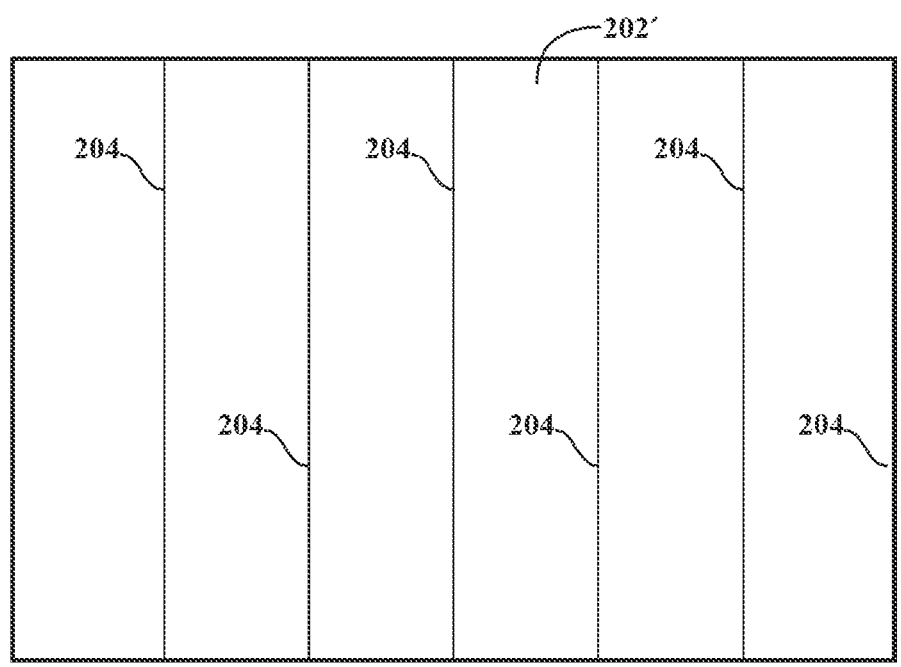
FIG. 10 schematically illustrates an exemplary separator having reduced porosity regions to improve waveguide performance of highly porous separators.

While there are several ways to create reduced porosity regions, the simplest is to locally heat the separator above the melting point of the polymer from which it is made so that the flow of the polymer can reduce the porosity at heated regions. Such localized heating can be performed using a laser or hot element to create the locally heated regions. Reduced porosity regions will also enable a separator to be used with a much lower refractive index electrolyte, such as a carbonate. A key to using reduced porosity regions is that the spacing between the regions must be of the same order of magnitude or smaller than the features being detected. An exemplary separator 202' showing reduced porosity regions 204 is shown in FIG. 10. Thus, if dendrites to be detected are 2 mm in size, the regions could be spaced 1 mm apart. If the width of the regions is 10 microns, then only 1% of the separator has reduced porosity, thus not altering its ability to transport ions.

Creating local structures more suited to what is needed for waveguiding light can also be performed by laminating multiple unclad optical fibers between two thin separators. For such embodiments, the refractive index of the separator with electrolyte would need to be below that of the optical fiber so that the fiber would remain light guiding. Again, the spacing between the fibers would be of the same order of magnitude or smaller than the size of the feature to be detected.

Thus, index matching of PVDF separators with commonly used carbonates in accordance with the teachings of the present application, when used with conventional battery electrolytes and a commercially available separator, greatly increases the probability that this aspect of the invention can be incorporated into commercial batteries.

An additional aspect of the teachings of the present application enables potentially enhanced measurement sensitivity over the above described techniques for measuring optical loss due to a dendrite or other local defect altering the optical properties of the separator. The previously described teachings presumed that the primary measurement would be of the optical transmission of light through the separator, and that the detection would be based on measuring loss in transmission due to the presence of a defect.

An alternate or complementary approach to detecting the presence of dendrites or other faults is to measure the increase in light scattered at a sharp angle relative to an original light propagation direction. In a separator with high transmission such as described above, there will be relatively little light scattered at large angles, such as 90 degrees to the light propagation direction. When a dendrite or other defect arises, the amount of light scattered into large angles may dramatically increase. Thus, the large relative increase in scattered light strength should be much easier to detect than a relatively small decrease in transmission.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A battery structure for monitoring development of impending faults of a battery cell comprising:
    a battery cell separator formed of a light transmitting material that has light transmission characteristics that are a function of a state of at least one impending fault of the battery cell including said separator;
    a first optical fiber positioned in optical communication with the battery cell separator to transmit light into said separator and being integrated into said separator;
    a second optical fiber positioned in optical communication with the battery cell separator to receive light transmitted through said separator and being integrated into said separator;
    a light source coupled to said first optical fiber; and
    a light detector coupled to said second optical fiber;
        wherein an impending fault state of a first portion of said battery cell associated with said second optical fiber is determined based on the light transmitted through said separator.

2. The battery structure for monitoring the development of impending faults of the battery cell of claim 1 wherein the cell separator is formed as a gelled polymer membrane.

3. The battery structure for monitoring the development of impending faults of the battery cell of claim 1 wherein the cell separator is formed as a porous polyolefin drawn to produce a highly porous membrane.

4. The battery structure for monitoring the development of impending faults of the battery cell of claim 3 wherein an associated electrolyte is selected so that a refractive index of the associated electrolyte is within a range corresponding to a range of a refractive index of the highly porous membrane.

5. The battery structure for monitoring the development of impending faults of the battery cell of claim 4 wherein the associated electrolyte is an ionic liquid.

6. The battery structure for monitoring the development of impending faults of the battery cell of claim 1 further comprising:
    a third optical fiber positioned in optical communication with the battery cell separator to receive light transmitted through said separator and being integrated into said separator; and
    a light detector coupled to said third optical fiber;
        wherein an impending fault state of a second portion of said battery cell associated with said third optical fiber is determined based on the light transmitted through said separator.

7. The battery structure for monitoring the development of impending faults of the battery cell of claim 1 further comprising an outer layer on at least one side of said separator imparting waveguide characteristics to said separator.

8. The battery structure for monitoring the development of impending faults of the battery cell of claim 7 wherein the at least one side of the separator includes spaced apart regions of reduced porosity.

9. The battery structure for monitoring the development of impending faults of the battery cell of claim 8 wherein spacing between the regions of reduced porosity are of the same order of magnitude or smaller than fault structures to be detected.

10. The battery structure for monitoring the development of impending faults of the battery cell of claim 7 further comprising an outer layer on first and second sides of said separator imparting waveguide characteristics to said separator.

11. The battery structure for monitoring the development of impending faults of the battery cell of claim 7 wherein said outer layer comprises a material having a refractive index lower than a refractive index of a core of said separator.

12. A method for monitoring a fault state of a battery cell comprising:
    forming a battery cell separator from a light transmitting material having light transmission characteristics that are a function of at least one impending fault of the battery cell including said separator;

providing a first optical fiber for transmitting light into said separator;

providing a second optical fiber for receiving light transmitted through said separator;

coupling a light source to said first optical fiber;

coupling a light detector to said second optical fiber; and determining an impending fault state of a first portion of said battery cell associated with said second optical fiber from an output of said light detector.

13. The method for monitoring the fault state of a battery as claimed in claim 12 further comprising:

providing a third optical fiber for receiving light transmitted through said separator;

coupling a light detector to said third optical fiber; and determining an impending fault state of a second portion of said battery cell associated with said third optical fiber from an output of said light detector coupled to said third optical fiber.

14. The method for monitoring the fault state of a battery as claimed in claim 12 further comprising forming an outer layer on at least one side of said separator to impart waveguide characteristics to said separator.

15. The method for monitoring the fault state of a battery as claimed in claim 14 further comprising forming an outer layer on first and second sides of said separator to impart waveguide characteristics to said separator.

16. The method for monitoring the fault state of a battery as claimed in claim 14 further comprising forming said outer layer of a material to have a refractive index lower than a refractive index of a core of said separator.

17. A battery structure for monitoring development of impending faults of a battery cell comprising:

a battery cell separator formed of a light transmitting material that has light scattering characteristics that are a function of the state of at least one impending fault of the battery cell including said separator;

a first optical fiber positioned in optical communication with the battery cell separator to transmit light into said separator and being integrated into said separator;

a second optical fiber positioned in optical communication with the battery cell separator to receive light scattered within said separator and being integrated into said separator;

a light source coupled to said first optical fiber; and a light detector coupled to said second optical fiber;

wherein an impending fault state of a first portion of said battery cell associated with said second optical fiber is determined based on the light scattered within said separator.

18. The battery structure for monitoring the development of impending faults of the battery cell of claim 17 wherein said light transmitting material also has light transmission characteristics that are a function of the state of the at least one impending fault of the battery cell including said separator and further comprising:

a third optical fiber positioned in optical communication with the battery cell separator to receive light transmitted through said separator and being integrated into said separator; and a light detector coupled to said third optical fiber;

wherein an impending fault state of a second portion of said battery cell associated with said third optical fiber is determined based on the light transmitted through the separator.

19. The battery structure for monitoring the development of impending faults of the battery cell of claim 17 wherein the second optical fiber receives light scattered at a sharp angle relative to an original light propagation direction within said separator.

20. The battery structure for monitoring the development of impending faults of the battery cell of claim 17 wherein the cell separator is formed as a gelled polymer membrane.

21. The battery structure for monitoring the development of impending faults of the battery cell of claim 17 wherein the cell separator is formed as a porous polyolefin drawn to produce a highly porous membrane.

22. The battery structure for monitoring the development of impending faults of the battery cell of claim 21 wherein an associated electrolyte is selected so that a refractive index of the associated electrolyte is within a range corresponding to a range of a refractive index of the highly porous membrane.

23. The battery structure for monitoring the development of impending faults of the battery cell of claim 22 wherein the associated electrolyte is an ionic liquid.

* * * * *

UNITED STATES PATENT AND TRADEMARK OFFICE
CERTIFICATE OF CORRECTION

PATENT NO. : 10,439,255 B2
APPLICATION NO. : 14/414984
DATED : October 8, 2019
INVENTOR(S) : James E. Dvorsky et al.

It is certified that error appears in the above-identified patent and that said Letters Patent is hereby corrected as shown below:

On the Title Page

Item (72), delete "Alexander C. Morrow" and insert --C. Alexander Morrow--.

Signed and Sealed this
Seventeenth Day of December, 2019

Andrei Iancu
*Director of the United States Patent and Trademark Office*